(12) United States Patent
Park

(10) Patent No.: US 7,949,923 B2
(45) Date of Patent: May 24, 2011

(54) TEST ENTRY CIRCUIT AND METHOD FOR GENERATING TEST ENTRY SIGNAL

(75) Inventor: Jae-Boum Park, Kyoungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 344 days.

(21) Appl. No.: 12/165,008

(22) Filed: Jun. 30, 2008

(65) Prior Publication Data
US 2009/0168561 A1 Jul. 2, 2009

(30) Foreign Application Priority Data

Dec. 26, 2007 (KR) .................. 10-2007-0138021

(51) Int. Cl.
G06F 11/263 (2006.01)
G06F 11/30 (2006.01)
(52) U.S. Cl. ...................... 714/738; 714/720
(58) Field of Classification Search ............ None
See application file for complete search history.

(56) References Cited

U.S. PATENT DOCUMENTS
2003/0126529 A1* 7/2003 Cho .................. 714/720

FOREIGN PATENT DOCUMENTS
KR 1999-005719 1/1999
KR 1020000027556 A 5/2000
KR 1020030027317 A 4/2003

OTHER PUBLICATIONS

Notice of Allowance issued from Korean Intellectual Property Office on Jan. 29, 2010.
Notice of Preliminary Rejection issued from Korean Intellectual Property Office on Apr. 21, 2009 with an English Translation.

* cited by examiner

*Primary Examiner* — Robert Beausoliel
*Assistant Examiner* — Dipakkumar Gandhi
(74) *Attorney, Agent, or Firm* — IP & T Group LLP

(57) ABSTRACT

Test entry circuit and method for generating test entry signal including a first source signal generator configured to receive a test signal through a pad to generate a first mode source signal for a first test mode, a second source signal generator configured to count activation transitions of the test signal to generate a second mode source signal for a second test mode and an entry signal generator configured to receive the first and second mode source signals to generate a first test mode entry signal for entering the first test mode and a second test mode entry signal for entering the second test mode.

33 Claims, 5 Drawing Sheets

TEST ENTRY CIRCUIT AND METHOD FOR GENERATING TEST ENTRY SIGNAL

CROSS-REFERENCE TO RELATED APPLICATIONS

The present invention claims priority of Korean patent application number 10-2007-0138021, filed on Dec. 26, 2007, which is incorporated by reference in its entirety.

BACKGROUND OF THE INVENTION

The present invention relates to a semiconductor device, and more particularly, to a test entry circuit and a method for generating a variety of test entry signals for performing respective test modes at a wafer level.

A semiconductor device such as a double data rate synchronous DRAM (DDR SDRAM) has a variety of test modes to screen unstable circuits in the device. The test modes include a wafer test mode for performing a test at a wafer level, and a package test mode for performing a test at a package level after the wafer test.

The wafer test mode is divided into a wafer burn-in test mode and a wafer normal test mode according to the object of the test mode.

The wafer burn-in test mode is performed to screen semiconductor devices having defects generated during the fabrication process. In the wafer burn-in test mode, a stress is applied to drive the semiconductor device with a high drive voltage at a high temperature to thereby find unstable factors in the semiconductor device. As such, the wafer burn-in test mode makes it possible to reduce unnecessary package cost and improve final test yield.

The wafer normal test mode is performed to determine whether the functions and performances of the semiconductor device meet the specifications of the semiconductor design or not. In the wafer normal test mode, probing pins of a test apparatus are electrically connected to pads to apply predetermined voltage to the pads or receive desired voltage from the pads. Consequently, by performing the predetermined operations according to the normal test mode, it is possible to improve the product completeness and reduce the development time. In addition, the normal test mode is also performed to reduce the number of probing pins required for the test. For example, in a case where a signal of a logic high level is applied to first and second pads for the normal test mode, the number of probing pins for each semiconductor device can be reduced by connecting the first and second pads inside the chip and applying the signal of the logic high level to the first and second pads through a single probing pin.

FIG. 1 is a block diagram of a conventional test entry circuit.

Referring to FIG. 1, the conventional test entry circuit includes a first pad 110, a burn-in test entry signal generator 130, a second pad 150, a normal test entry signal generator 170 and a power up signal generator 190 connected to external power supply voltage VDD and ground VSS.

The burn-in test entry signal generator 130 receives a burn-in test signal WBI through the first pad 110 to generate a burn-in test entry signal WBI_EN. The normal test entry signal generator 170 receives a normal test signal WNM through the second pad 150 to generate a normal test entry signal WNM_EN.

The burn-in test signal WBI is activated in a burn-in test mode, and the normal test signal WNM is activated in a normal test mode.

The power up signal generator 190 detects a voltage level of the external power supply voltage VDD to generate a power up signal PWRUPb. As the voltage level of the initial external power supply voltage VDD increases, the voltage level of the power up signal PWRUPb also increases. However, if the voltage level of the external power supply voltage VDD exceeds a desired target level, the voltage level of the power up signal PWRUPb is fixed to a logic low level. The burn-in test entry signal generator 130 and the normal test entry signal generator 170 are initialized in response to the power up signal PWRUPb.

FIG. 2 is a circuit diagram of the burn-in test entry signal generator 130 shown in FIG. 1.

Referring to FIG. 2, the burn-in test entry signal generator 130 includes a first output unit 210 and a first initialization unit 230. The first output unit 210 generates the burn-in test entry signal WBI_EN in response to the burn-in test signal WBI. The first initialization unit 230 initializes an input node of the first output unit 210 in response to the power up signal PWRUPb.

As the voltage level of the external power supply voltage VDD increases, the first initialization unit 230 is enabled to initialize an input node of the first output unit 210 to a logic low level. Then, the first output unit 210 outputs the burn-in test entry signal WBI_EN of a logic low level. When the power up signal PWRUPb changes to a logic low level, the first initialization unit 230 terminates the initialization. When the burn-in test signal WBI changes to a logic high level to start the burn-in test mode, the first output unit 210 outputs the burn-in test entry signal WBI_EN of a logic high level. Then, the semiconductor device enters the burn-in test mode in response to the burn-in test entry signal WBI_EN.

FIG. 3 is a circuit diagram of the normal test entry signal generator 170 shown in FIG. 1.

Referring to FIG. 3, the normal test entry signal generator includes a second output unit 310 and a second initialization unit 330. The second output unit 310 generates a normal test entry signal WNM_EN in response to a normal test signal WNM. The second initialization unit 330 initializes an input node of the second output unit 310 in response to a power up signal PWRUPb.

Operations of the normal test entry signal generator 170 are similar to those of the burn-in test entry signal generator 130. The second initialization unit 330 is enabled in response to a power up signal PWRUPb. Then, the second initialization unit 330 initializes an input node of the second output unit 310 to a logic low level, so that the second output unit 310 outputs the normal test entry signal WNM_EN of a logic low level. When the normal test signal WNM changes to a logic high level to start the normal test mode, the second output unit 310 outputs the normal test entry signal WNM_EN of a logic high level. Then, the semiconductor device enters the normal test mode in response to the normal test entry signal WNM_EN.

Referring again to FIG. 1, the first pad 110 is configured to receive the burn-in test signal WBI, and the second pad 150 is configured to receive the normal test signal WNM.

SUMMARY OF THE INVENTION

Embodiments of the present invention are directed to providing a test entry circuit for generating a test entry signal for a desired test mode with a reduced number of pads.

Embodiments of the present invention are also directed to providing a method for generating a variety of test entry signals according to a waveform of a test signal applied to a single pad. In accordance with an aspect of the present invention, there is provided a test entry circuit that includes a first source signal generator configured to receive a test signal through a pad to generate a first mode source signal for a first test mode, a second source signal generator configured to count activation transitions of the test signal to generate a second mode source signal for a second test mode and an entry signal generator configured to receive the first and second mode source signals to generate a first test mode entry signal for entering the first test mode and a second test mode entry signal for entering the second test mode. In accordance with another aspect of the present invention, there is provided a test entry circuit that includes a power up signal generator configured to receive an external power source voltage to generate a power up signal, a first source signal generator configured to receive a test signal through a pad to generate a first mode source signal for a first test mode, a second source signal generator configured to receive the power up signal and count activation transitions of the test signal to generate a second mode source signal for a second test mode and an entry signal generator configured to receive the first and second mode source signals to generate a first test mode entry signal for entering the first test mode and a second test mode entry signal for entering the second test mode. In accordance with another aspect of the present invention, there is provided a method for generating a test entry signal, the method includes a step of generating a first mode source signal for a first test mode according to a voltage level of a test signal, a step of generating a second mode source signal for a second test mode in response to an activation transition of the test signal after toggling of the test signal and a step of receiving the first and second mode source signals to generate a first test mode entry signal for entering the first test mode and a second test mode entry signal for entering the second test mode.

The test entry circuit can generate a variety of test entry signals using the test signal received through a single pad, and the toggling number of the test signal received through the pad as a key. As such, the test entry circuit can reduce the number of pads in comparison to the conventional test entry circuit that requires at least two pads including a pad for receiving the normal test signal and that for receiving the burn-in test signal.

DESCRIPTION OF SPECIFIC EMBODIMENTS

Hereinafter, a test entry circuit and a method for generating a test entry signal in accordance with the present invention will be described in detail with reference to the accompanying drawings.

Figure 1:
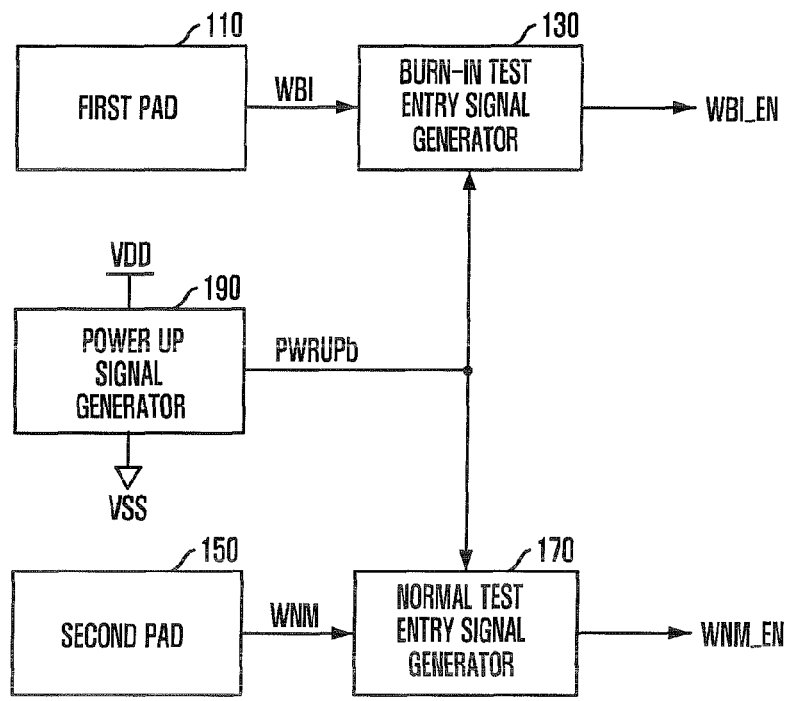
FIG. 1 is a block diagram of a conventional test entry circuit
Figure 2:
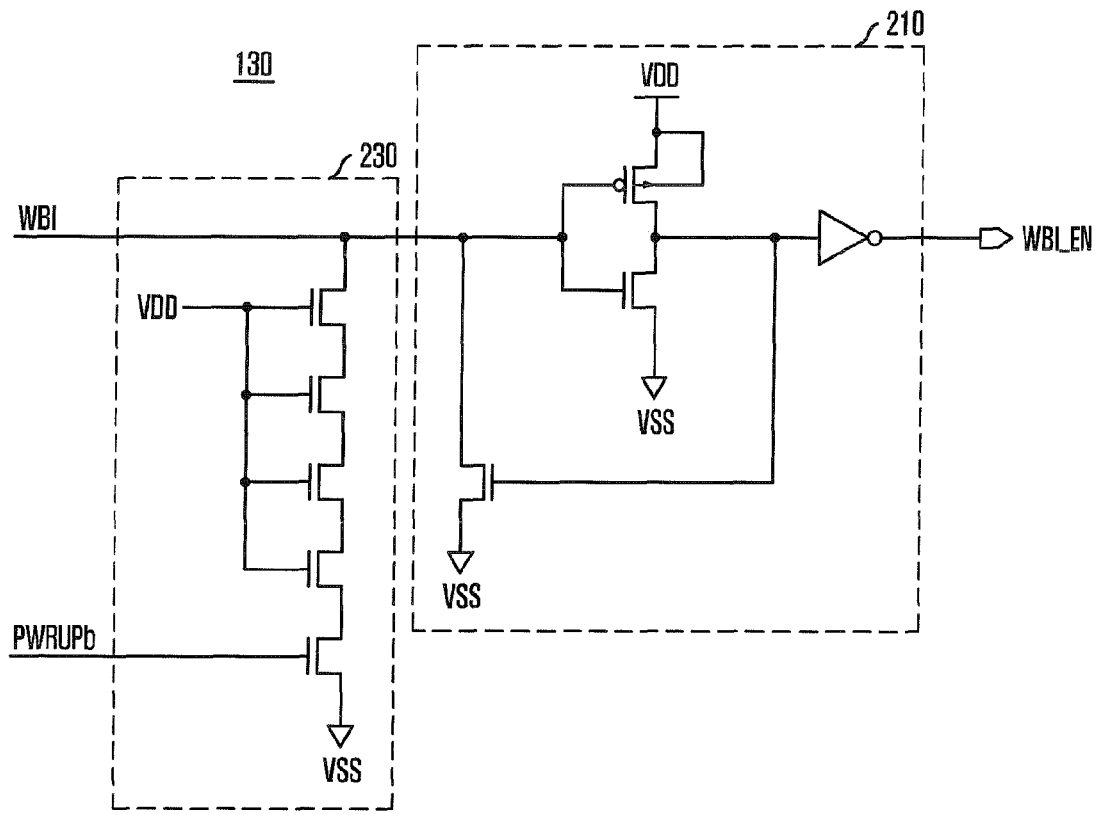
FIG. 2 is a circuit diagram of a burn-in test entry signal generator (130) shown in FIG. 1.
Figure 3:
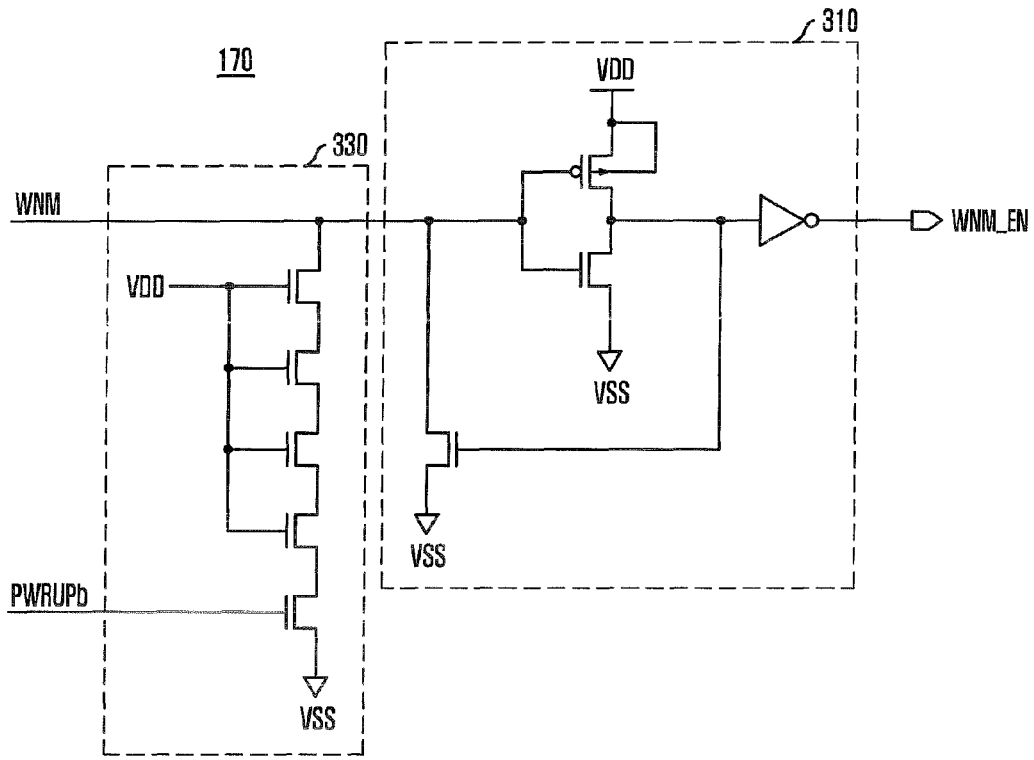
FIG. 3 is a circuit diagram of a normal test entry signal generator (170) shown in FIG. 1.
Figure 4:
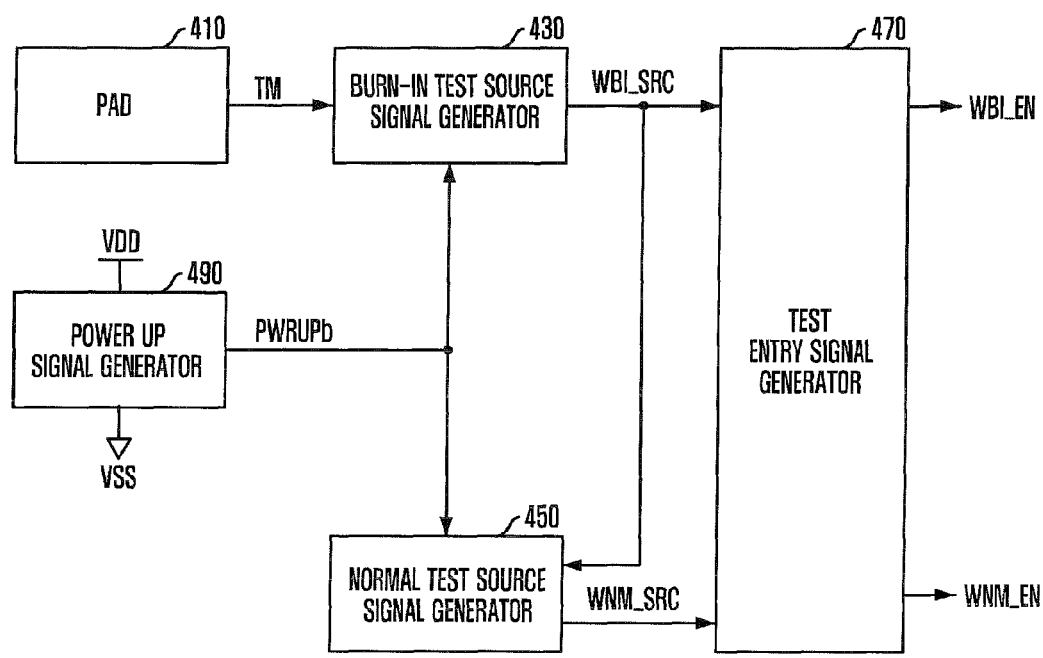
FIG. 4 is a block diagram of a test entry circuit in accordance with an embodiment of the present invention.

FIG. 4 is a block diagram of a test entry circuit in accordance with an embodiment of the present invention.

Referring to FIG. 4, the test entry circuit includes a pad 410, a burn-in test source signal generator 430, a normal test source signal generator 450, a test entry signal generator 470 and a power up signal generator 490.

The burn-in test source signal generator 430 generates burn-in test source signal WBI_SRC in response to a test signal TM received through the pad 410. The burn-in test source signal WBI_SRC may be input to the normal test source signal generator 450 and the test entry signal generator 470.

The normal test source signal generator 450 counts activation transitions of the burn-in test source signal WBI_SRC to generate a normal test source signal WNM_SRC according to the counting result.

The test entry signal generator 470 receives the burn-in test source signal WBI_SRC and the normal test source signal WNM_SRC to generate a burn-in test entry signal WBI_EN and a normal test entry signal WNM_EN.

The power up signal generator 490 detects voltage level of the external power source voltage VDD to generate a power up signal PWRUPb. As the voltage level of the initial external power supply voltage VDD increases, the voltage level of the power up signal PWRUPb also increases. However, if the voltage level of the external power supply voltage VDD exceeds a desired target level, the voltage level of the power up signal PWRUPb is fixed to a logic low level. The burn-in test source signal generator 430 and the normal test source signal generator 450 are initialized in response to the power up signal PWRUPb.

Figure 5:
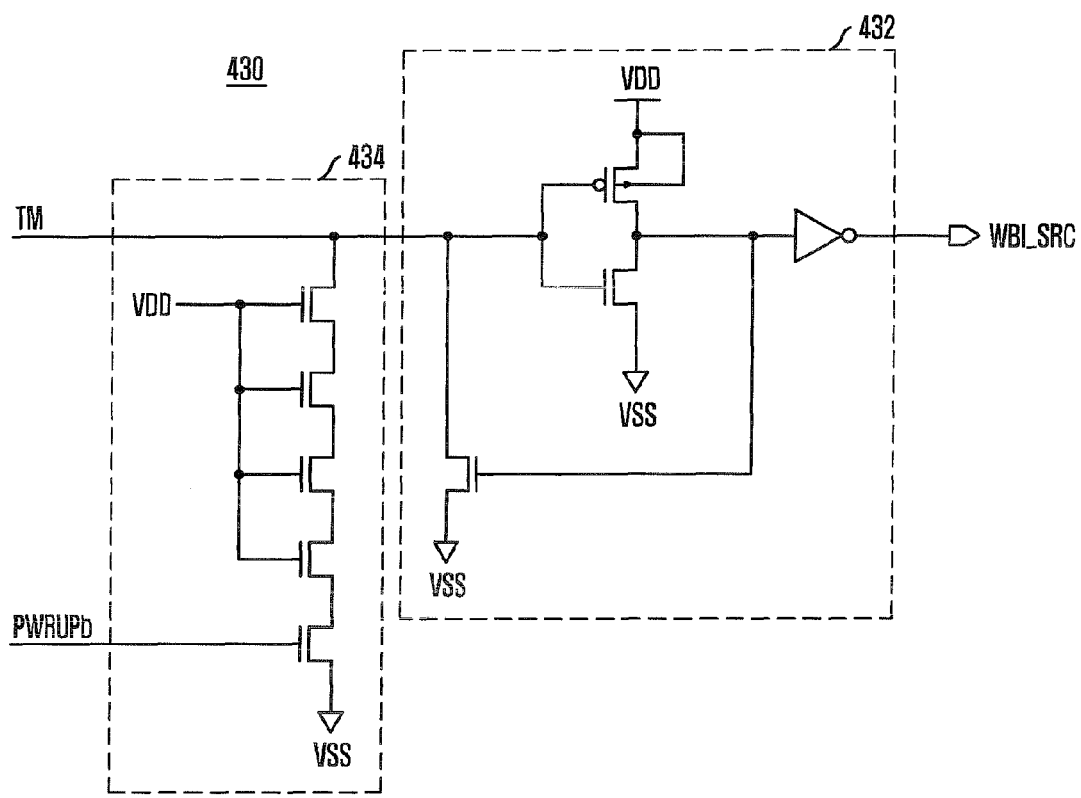
FIG. 5 is a circuit diagram of a burn-in test source signal generator (430) shown in FIG. 4.

FIG. 5 is a circuit diagram of the burn-in test source signal generator 430 shown in FIG. 4.

Referring to FIG. 5, the burn-in test source signal generator 430 includes a first output unit 432 and a first initialization unit 434. The first output unit 432 generates a burn-in test source signal WBI_SRC in response to the test signal TM. The first initialization unit 434 initializes an input node of the first output unit 432 in response to the power up signal PWRUPb.

As the voltage level of the external power supply voltage VDD increases, the first initialization unit 434 is enabled to initialize an input node of the first output unit 432 to a logic low level. Then, the first output unit 432 outputs the burn-in test source signal WBI_SRC of a logic low level. When the power up signal PWRUPb changes to a logic low level, the first initialization unit 434 terminates the initialization. When the test signal TM changes to a logic high level to start the burn-in test mode, the first output unit 432 outputs the burn-in test source signal WBI_SRC of a logic high level.

Figure 6:
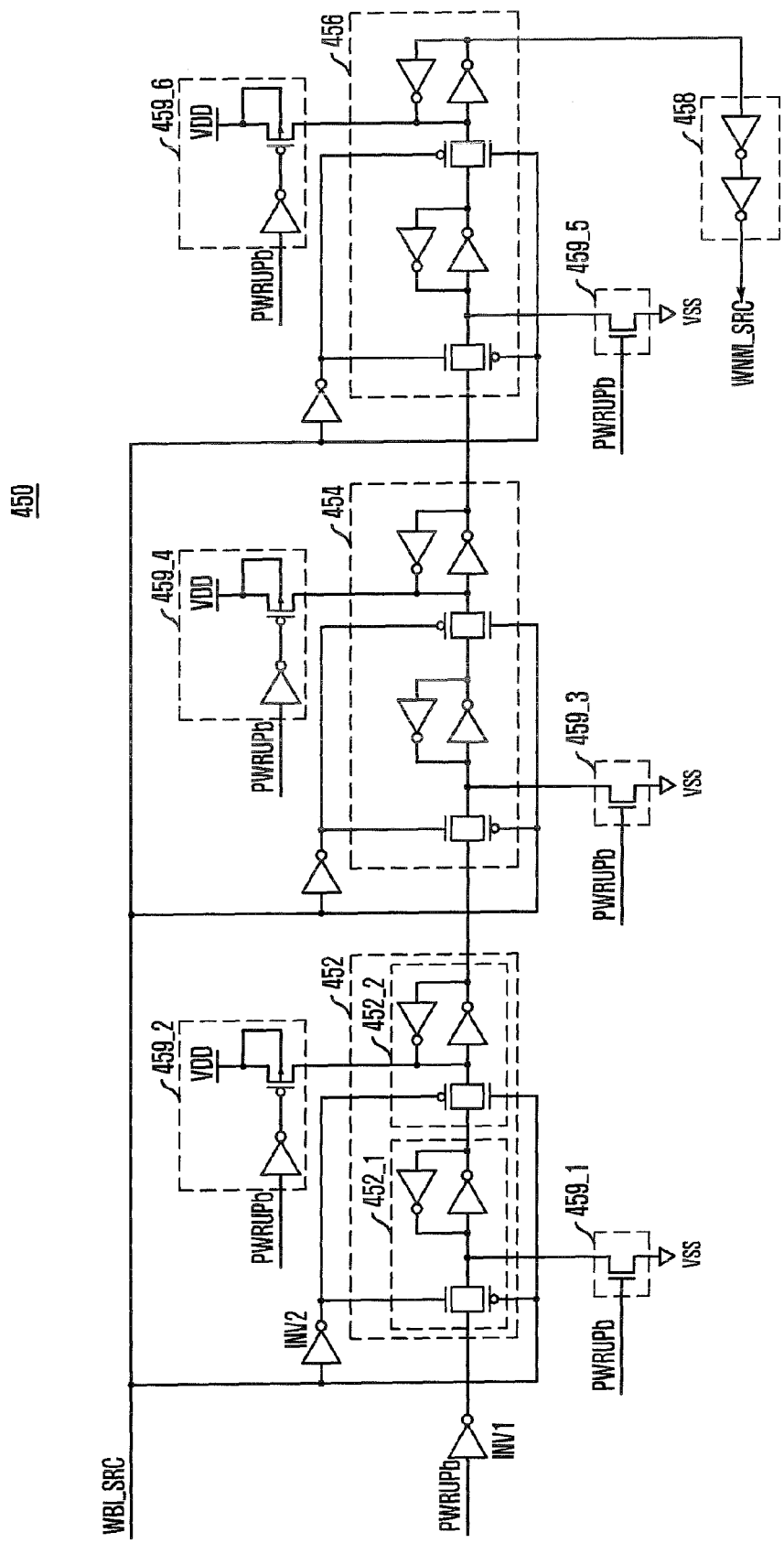
FIG. 6 is a circuit diagram of a normal test source signal generator (450) shown in FIG. 4.

FIG. 6 is a circuit diagram of the normal test source signal generator 450 shown in FIG. 4.

Referring to FIG. 6, the normal test source signal generator 450 may include first to third shift units 452, 454 and 456, a second output unit 458, and a plurality of second initialization units 459_1, 459_2, 459_3, 459_4, 459_5 and 459_6.

The first to third shift units 452, 454 and 456 sequentially shift an input signal in response to the burn-in test source signal WBI_SRC. The first shift unit 452 receives an output signal of a first inverter INV1, i.e., an inverted signal of the power up signal PWRUPb, to shift it in response to the burn-in test source signal WBI_SRC. The second shift unit 454 shifts an output signal of the first shift unit 452 in response to the burn-in test source signal WBI_SRC. The third shift unit 456 shifts an output signal of the second shift unit 454 in response to the burn-in test source signal WBI_SRC. The plurality of second initialization units 459_1, 459_2, 459_3, 459_4, 459_5 and 459_6 initialize respective nodes in response to the power up signal PWRUPb.

The first to third shift units 452, 454 and 456 have similar configurations, and thus only the configuration of the first shift unit 452 will be described herein.

The first shift unit 452 includes a first latch unit 452_1 and a second latch unit 452_2. The first latch unit 452_1 latches the output signal of the first inverter INV1 in response to the burn-in test source signal WBI_SRC. The second latch unit 452_2 latches an output signal of the first latch unit 452_1 in response to the burn-in test source signal WBI_SRC.

In simple operation, as the voltage level of the initial external power supply voltage VDD increases, the plurality of second initialization units 459_1, 459_2, 459_3, 459_4, 459_5 and 459_6 are enabled to initialize respective nodes to a logic low level or a logic high level. Then, the normal test source signal WNM_SRC changes to a logic low level.

The first to third shift units 452, 454 and 456 is controlled by the burn-in test source signal WBI_SRC. The burn-in test source signal WBI_SRC varies with the test signal TM. That is, the burn-in test source signal WBI_SRC changes to a logic high level when the test signal TM changes to a logic high level, and the burn-in test source signal WBI_SRC changes to a logic low level when the test signal TM changes to a logic low level.

Thereafter, if the power up signal PWRUPb changes to a logic low level, the plurality of second initialization units 459_1, 459_2, 459_3, 459_4, 459_5 and 459_6 terminate the initialization.

The first shift unit 452 latches the output signal of the first inverter INV1 in response to the burn-in test source signal WBI_SRC and an output signal of the second inverter INV2. When the burn-in test source signal WBI_SRC has a logic low level, the first latch unit 452_1 latches the output signal of the first inverter INV1. When the burn-in test source signal WBI_SRC has a logic high level, the second latch 452_2 latches the output signal of the first latch unit 452_1.

Operations of the second and third shift units 454 and 456 are the same as that of the first shift unit 452. Consequently, the first to third shift units 452, 454 and 456 shift the output signal of the first inverter INV1 having a logic high level, and the second output unit 458 outputs the shifted signal as a normal test source signal WNM_SRC. In other words, the first shift unit 452 transfers the output signal of the first inverter INV1 to the second shift unit 454 in response to an activation transition, which is a transition of the burn-in test source signal WBI_SRC from a logic low level to a logic high level. The second shift unit 454 transfers the output signal of the first shift unit 452 to the third shift unit 456 in response to an activation transition of the burn-in test source signal WBI_SRC. The third shift unit 456 transfers the output signal of the second shift unit 454 to the second output unit 458 in response to an activation transition of the burn-in test source signal WBI_SRC. The second output unit 458 receives the shifted signal from the third shift unit 456 to output it as a normal test source signal WNM_SRC.

Shifting operations of the first to third shift units 452, 454 and 456 are similar to the counting operations. That is, it is also possible to count the activation transitions of the burn-in test source signal WBI_SRC to output the normal test source signal WNM_SRC in response to the third activation transition. In this case, it is preferable that the normal test source signal generator 450 further includes a counter for counting the activation transitions of the burn-in test source signal WBI_SRC.

Meanwhile, the first inverter INV1 receives the power up signal PWRUPb for a stable operation of the test entry circuit. However, if the voltage level of the external power source voltage VDD is higher than a stable target level, it is also possible that the first inverter INV1 receives other signal of a predetermined logic level such as a logic low level.

Figure 7:
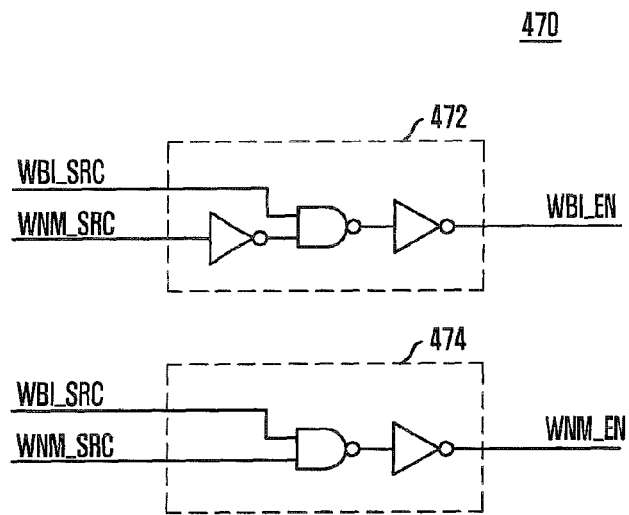
FIG. 7 is a circuit diagram of a test entry signal generator (470) shown in FIG. 4.

FIG. 7 is a circuit diagram of the test entry signal generator 470 shown in FIG. 4.

Referring to FIG. 7, the test entry signal generator 470 includes a burn-in test entry signal generation unit 472 and a normal test entry signal generation unit 474. The burn-in test entry signal generation unit 472 receives the burn-in test source signal WBI_SRC and the normal test source signal WNM_SRC to generate the burn-in test entry signal WBI_EN. The normal test entry signal generation unit 474 receives the burn-in test source signal WBI_SRC and the normal test source signal WNM_SRC to generate the normal test entry signal WNM_EN.

The normal test source signal WNM_SRC changes to a logic high level when the burn-in test source signal WBI_SRC activates to a logic high level three times. Therefore, the burn-in test entry signal WBI_EN is activated in response to the burn-in test source signal WBI_SRC. That is, when the burn-in test source signal WBI_SRC changes to a logic high level, the burn-in test entry signal WBI_EN changes to a logic high level. Then, the semiconductor device enters the burn-in test mode in response to the burn-in test entry signal WBI_EN.

Similarly, in order to enter the normal test mode, the normal test source signal WNM_SRC is activated three times. That is, when the burn-in test source signal WBI_SRC and the normal test source signal WNM_SRC changes to a logic high level, the normal test entry signal WNM_EN is activated to a logic high level. Then, the semiconductor device enters the normal test mode in response to the normal test entry signal WNM_EN.

Figure 8:
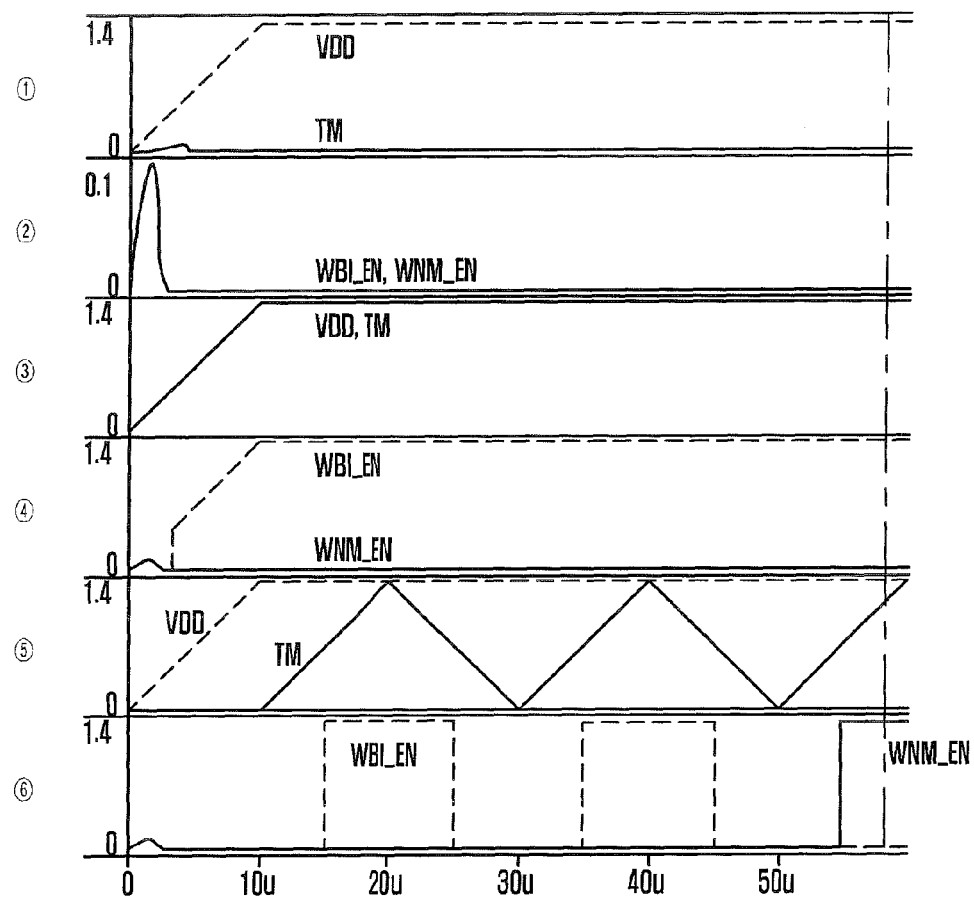
FIG. 8 is a timing diagram of signals in test modes in accordance with the embodiment of the present invention.

FIG. 8 is a timing diagram of the signals in the test modes in accordance with the embodiment of the present invention.

Symbol ① of FIG. 8 illustrates waveforms of the external power supply voltage VDD and the test signal TM in the normal mode where the test signal TM has a logic low level. Symbol ② of FIG. 8 illustrates waveforms of the burn-in test entry signal WBI_EN and the normal test entry signal WNM_EN in the normal mode.

Referring to symbols ① and ②, in the normal mode, the test signal TM has a logic low level, and thus the burn-in test entry signal WBI_EN and the normal test entry signal WNM_EN are not activated.

Symbol ③ of FIG. 8 illustrates waveforms of the external power source voltage VDD and the test signal TM in the burn-in test mode. Symbol ④ of FIG. 8 illustrates waveforms of the burn-in test entry signal WBI_EN and the normal test entry signal WNM_EN.

Referring to symbols ③ and ④, the test signal TM has a logic high level, and thus the burn-in test entry signal WBI_EN is activated to a logic high level, and the normal test entry signal WNM_EN is deactivated to a logic low level. Then, the semiconductor device enters the burn-in test mode in response to the burn-in test entry signal WBI_EN.

Symbol ⑤ of FIG. 8 illustrates waveforms of the external power supply voltage VDD and the test signal TM in the normal test mode. Symbol ⑥ of FIG. 8 illustrates waveforms of the burn-in test entry signal WBI_EN and the normal test entry signal WNM_EN in the normal test mode.

Referring to symbols ⑤ and ⑥, as the test signal toggles twice, using this as a key, the normal test entry signal WNM_EN is activated to a logic high level and the normal test entry signal WNM_EN is deactivated to a logic low level in response to the subsequent activation transition of the test signal TM. Then, the semiconductor device enters the normal test mode in response to the normal test entry signal WNM_EN. Although the normal test entry signal WNM_EN is described to be activated at the timing of the third activation transition of the test signal TM, it may also be activated at the timing of the second activation transition, or other activation transition of the test signal TM according to the configurations of the semiconductor device.

As described above, the test entry circuit can generate the burn-in test entry signal WBI_EN and the normal test entry signal WNM_EN according to the input waveform of the test signal TM received through a single pad 410 in FIG. 4. That is, the test entry circuit can generate the burn-in test entry signal WBI_EN and the normal test entry signal WNM_EN using the test signal TM and the toggling number of the test signal TM as a key.

In addition, the test entry circuit in accordance with the embodiments of the present invention requires only one pad. Accordingly, it is possible to reduce the size of the semiconductor device and increase the net die, thereby allowing mass production and keeping overall cost down.

In summary, by reducing the number of pads, the size of the semiconductor device can be reduced and the net die can be increased, so that mass production and overall cost reduction can be realized.

While the present invention has been described with respect to the specific embodiments, it should be understood that the descriptions of the specific embodiments are merely illustrative and that it should not be taken in a limiting sense. In addition, it will be apparent to those skilled in the art that various changes and modifications may be made without departing from the spirit and scope of the invention as defined in the following claims.

Further, the locations and the kinds of the logic gates and the transistors may be realized differently according to the polarity of the received signal.

Furthermore, although the configurations and operations of the test entry circuit for entering the wafer burn-in test mode and the wafer normal test mode are described above, the embodiments of the present invention can also be applied to various other test modes.

What is claimed is:

1. A test entry circuit, comprising:
    a first source signal generator configured to receive a test signal through a pad to generate a first mode source signal to use in a first test mode;
    a second source signal generator configured to count activation transitions of the first mode source signal to generate a second mode source signal to use in a second test mode; and
    an entry signal generator configured to receive the first and second mode source signals to generate a first test mode entry signal to enter the first test mode and a second test mode entry signal to enter the second test mode,
    wherein the pad is coupled to probing pins of a test apparatus during the first and second test modes.

2. The test entry circuit as recited in claim 1, wherein the second source signal generator comprises:
    a plurality of shift units connected in series and configured to sequentially shift an input signal to output a shifted signal in response to the first mode source signal; and
    an output unit configured to receive the shifted signal to output the second mode source signal.

3. The test entry circuit as recited in claim 2, wherein each of the plurality of shift units comprises:
    a first latch unit configured to latch the input signal in response to a first edge of the first mode source signal; and
    a second latch unit configured to latch the input signal received from the first latch unit in response to a second edge of the first mode source signal.

4. The test entry circuit as recited in claim 2, wherein the input signal has a constant logic level when a voltage level of an external power supply voltage is higher than a target level.

5. The test entry circuit as recited in claim 1, wherein the first mode source signal comprises the test signal.

6. The test entry circuit as recited in claim 1, wherein the first test mode entry signal is activated in a wafer burn-in test mode, and the second test mode entry signal is activated in a wafer normal test mode.

7. The test entry circuit as recited in claim 1, wherein the second source signal generator comprises:
    a count unit configured to count the activation transitions of the first mode source signal; and
    an output unit configured to receive an output signal of the count unit to output the second mode source signal.

8. The test entry circuit as recited in claim 1, wherein the second test mode entry signal is activated at a timing when the test signal is activated at least a second time.

9. A test entry circuit, comprising:
    a power up signal generator configured to receive an external power source voltage to generate a power up signal;
    a first source signal generator configured to receive a test signal through a pad to generate a first mode source signal to use in a first test mode;
    a second source signal generator configured to receive the power up signal and count activation transitions of the first mode source signal to generate a second mode source signal to use in a second test mode; and
    an entry signal generator configured to receive the first and second mode source signals to generate a first test mode entry signal to enter the first test mode and a second test mode entry signal to enter the second test mode,
    wherein the pad is coupled to probing pins of a test apparatus during the first and second test modes.

10. The test entry circuit as recited in claim 9, further comprising an initialization unit configured to initialize a line to transfer the test signal in response to the power up signal.

11. The test entry circuit as recited in claim 10, wherein the second source signal generator comprises:
    a plurality of shift units connected in series and configured to sequentially shift the power up signal to output a shifted power up signal in response to the first mode source signal; and
    an output unit configured to receive the shifted power up signal to output the second mode source signal.

12. The test entry circuit as recited in claim 11, wherein one of the plurality of shift units comprises:
    a first latch unit configured to latch the power up signal in response to a first edge of the first mode source signal; and
    a second latch unit configured to latch the power up signal received from the first latch unit in response to a second edge of the first mode source signal.

13. The test entry circuit as recited in claim 10, wherein the first mode source signal comprises the test signal.

14. The test entry circuit as recited in claim 10, wherein the second source signal generator comprises:
    a count unit configured to count activation transitions of the first mode source signal; and
    an output unit configured to receive an output signal of the count unit to output the second mode source signal.

15. The test entry circuit as recited in claim 10, wherein the first test mode entry signal is activated in a wafer burn-in test mode, and the second test mode entry signal is activated in a wafer normal test mode.

16. The test entry circuit as recited in claim 10, wherein the power up signal has a constant logic level when a voltage level of an external power supply voltage is higher than a target level.

17. The test entry circuit as recited in claim 10, wherein the second test mode entry signal is activated at a timing when the test signal is activated at least a second time.

18. The test entry circuit as recited in claim 9, wherein the second source signal generator comprises:
   a plurality of shift units connected in series and configured to sequentially shift the power up signal to output a shifted power up signal in response to the first mode source signal; and
   an output unit configured to receive the shifted power up signal to output the second mode source signal.

19. The test entry circuit as recited in claim 18, wherein one of the plurality of shift units comprises:
   a first latch unit configured to latch the power up signal in response to a first edge of the first mode source signal; and
   a second latch unit configured to latch the power up signal received from the first latch unit in response to a second edge of the first mode source signal.

20. The test entry circuit as recited in claim 9, wherein the first mode source signal comprises the test signal.

21. The test entry circuit as recited in claim 9, wherein the second source signal generator comprises:
   a count unit configured to count activation transitions of the first mode source signal; and
   an output unit configured to receive an output signal of the count unit to output the second mode source signal.

22. The test entry circuit as recited in claim 9, wherein the first test mode entry signal is activated in a wafer burn-in test mode, and the second test mode entry signal is activated in a wafer normal test mode.

23. The test entry circuit as recited in claim 9, wherein the power up signal has a constant logic level when a voltage level of an external power supply voltage is higher than a target level.

24. The test entry circuit as recited in claim 9, wherein the second test mode entry signal is activated at a timing when the test signal is activated at least a second time.

25. A method for generating a test entry signal, the method comprising:
   generating a first mode source signal for a first test mode according to a voltage level of a test signal input through a pad;
   generating a second mode source signal for a second test mode in response to an activation transition of the first mode source signal after toggling of the first mode source signal; and
   receiving the first and second mode source signals to generate a first test mode entry signal for entering the first test mode and a second test mode entry signal for entering the second test mode,
   wherein the pad is coupled to probing pins of a test apparatus during the first and second test modes.

26. The method as recited in claim 25, wherein the generating of the second mode source signal comprises:
   sequentially shifting an input signal in response to the first mode source signal; and
   receiving the shifted input signal to output the second mode source signal.

27. The method as recited in claim 26, wherein the input signal has a constant logic level when a voltage level of an external power supply voltage is higher than a target level.

28. The method as recited in claim 26, wherein the sequentially shifting of the input signal comprises:
   latching the input signal in response to a first edge of the first mode source signal; and
   latching the latched signal in response to a second edge of the first mode source signal.

29. The method as recited in claim 25, wherein the first mode source signal comprises the test signal.

30. The method as recited in claim 25, wherein the generating of the second mode source signal comprises:
   counting activation transitions of the first mode source signal; and
   outputting the second mode source signal according to the counting result.

31. The method as recited in claim 25, wherein the first test mode entry signal is activated in a wafer burn-in test mode, and the second test mode entry signal is activated in a wafer normal test mode.

32. The method as recited in claim 25, further comprising generating a power up signal of a constant logic level when a voltage level of an external power supply voltage is higher than a target level.

33. The method as recited in claim 32, wherein the input signal comprises the power up signal.

* * * * *